(12) United States Patent
Anderl et al.

(10) Patent No.: US 7,334,662 B1
(45) Date of Patent: Feb. 26, 2008

(54) EQUIPMENT ENCLOSURE ACOUSTICAL DOOR WITH LOW IMPEDANCE DISTRIBUTED AIR FLOW

(75) Inventors: William James Anderl, Rochester, MN (US); Michael Desmond O'Connell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 11/201,976

(22) Filed: Aug. 11, 2005

(51) Int. Cl.
| | |
|---|---|
| G06F 1/20 | (2006.01) |
| H05K 7/20 | (2006.01) |
| G10K 11/16 | (2006.01) |
| B41J 29/08 | (2006.01) |
| H05K 5/03 | (2006.01) |
| B41J 29/10 | (2006.01) |

(52) U.S. Cl. .................. 181/200; 181/201; 181/224; 361/687; 361/688

(58) Field of Classification Search .......... 181/200, 181/201, 202, 224, 225, 226, 210, 293; 361/687, 361/689, 688, 690, 692
See application file for complete search history.

(56) References Cited

U.S. PATENT DOCUMENTS

| | | | |
|---|---|---|---|
| 2,869,671 A * | 1/1959 | Schlachter et al. ......... 181/222 |
| 3,059,564 A * | 10/1962 | Curran et al. ............... 454/262 |
| 3,120,876 A * | 2/1964 | Lirette ........................ 181/229 |
| 3,330,379 A * | 7/1967 | Cook .......................... 181/224 |
| 3,452,667 A * | 7/1969 | Herb et al. .................. 454/324 |
| 3,642,093 A * | 2/1972 | Schach ....................... 181/239 |
| 3,855,910 A * | 12/1974 | Brinton et al. .............. 454/365 |
| 3,949,830 A * | 4/1976 | Muehlbauer et al. ....... 181/224 |
| 4,289,096 A * | 9/1981 | Latham et al. ........... 123/198 E |
| RE31,275 E * | 6/1983 | Wirt ............................ 181/224 |
| 4,659,349 A * | 4/1987 | Rodi et al. ................. 55/385.4 |
| 4,660,676 A * | 4/1987 | Eustace ...................... 181/224 |
| 4,733,750 A * | 3/1988 | Poirier et al. ............... 181/202 |
| 5,125,474 A * | 6/1992 | Lee et al. .................... 181/204 |
| 5,332,872 A * | 7/1994 | Ewanek ...................... 181/224 |
| 5,467,250 A * | 11/1995 | Howard et al. ............. 361/696 |
| 5,717,572 A * | 2/1998 | Smith et al. ................ 361/695 |
| 5,728,979 A | 3/1998 | Yazici et al. |
| 5,782,546 A * | 7/1998 | Iwatare ....................... 312/236 |
| 6,104,608 A * | 8/2000 | Casinelli et al. ............ 361/692 |
| 6,164,369 A * | 12/2000 | Stoller ................... 165/104.33 |
| 6,198,627 B1 * | 3/2001 | Roehling et al. ........... 361/688 |
| 6,296,333 B1 * | 10/2001 | Lee et al. ................. 312/223.2 |
| 6,462,944 B1 * | 10/2002 | Lin .............................. 361/687 |
| 6,494,252 B1 * | 12/2002 | Takala et al. .......... 165/104.33 |

(Continued)

Primary Examiner—Edgardo San Martin
(74) Attorney, Agent, or Firm—Robert W. Lahtinen

(57) ABSTRACT

An acoustic door for an equipment enclosure, such as a rack mount cabinet, also provides a low impedance air flow uniformly delivered across the cabinet opening. A pair of metal panels, with acoustic foam along the rear surfaces, extend angularly outward and toward one another to form an air inlet opening between the outer edges. A central column is positioned between the panels which, in a horizontal section, forms an aerodynamic dome which has a continuously curved sheet metal surface at the front and sides that also captures a core of acoustic foam that is exposed at the rear. A rigid vane is disposed at each lateral side and parallel to the central column to cause air to follow the column surface, deflecting air behind the column and effecting uniform delivery of air flow across the cabinet front opening at the rear opening of the door.

12 Claims, 3 Drawing Sheets

U.S. PATENT DOCUMENTS

| | | | |
|---|---|---|---|
| 6,606,876 B1 * | 8/2003 | Giordano | 62/244 |
| 6,983,566 B2 * | 1/2006 | Laun et al. | 49/507 |
| 7,046,470 B2 * | 5/2006 | Yamanashi et al. | 360/69 |
| 7,161,801 B2 * | 1/2007 | Chen et al. | 361/690 |
| 2002/0050418 A1 | 5/2002 | Jenvey | |
| 2005/0286223 A1 * | 12/2005 | Morales | 361/690 |

* cited by examiner

EQUIPMENT ENCLOSURE ACOUSTICAL DOOR WITH LOW IMPEDANCE DISTRIBUTED AIR FLOW

FIELD OF THE INVENTION

The present invention pertains to equipment enclosures and more particularly, to closure doors for such enclosures which enable noise attenuation and provide low impedance air flow through the door.

BACKGROUND OF THE INVENTION

Cabinets for rack mounted components must accommodate the need for both air flow and noise attenuation with respect to the cumulative requirements of diverse components that may be selected for mounting within the enclosure. Higher, more concentrated heat loads often increase not only the need for increased cooling air flow, but also the level of noise that must be attenuated. Further, neither the selection of rack mounted components, the positioning of such components within the enclosure, nor the overall cooling or noise attenuation requirements are subject to control by the designer of the equipment enclosure.

Heat loads in rack mounted computer equipment continue to rise with corresponding higher cooling requirements. In order to provide air cooling solutions, an increase in the volumetric air flow is required. The higher volumetric air flow is normally accompanied by higher acoustic noise levels which can result in a total system noise level that the customer will not accept or tolerate. One solution is to use doors with high acoustical noise attenuation. However, doors with high noise attenuation capability are prone to possess high air flow impedance and uneven air flow distribution as structures are employed to limit acoustical line of sight and physical depth is limited to minimize system footprint.

High air flow impedance can not be tolerated, since the enclosure system must be compatible with the cooling needs of the rack mounted components and not diminish the capability of the individual components to provide adequate cooling. If the impedance of the acoustical door is too high, it can also increase the flow balancing problems between rack modules with different types and sizes of air moving devices. Racks can house many different types of rack modules with different inlet and outlet air flow locations making necessary the uniform distribution of the incoming air at the rear of the door important for adequate rack module cooling. This design constraint is not made easier by the attempt to minimize the distance between the enclosure door and the rack mounted components in the attempt to minimize the overall depth of the enclosure. Minimizing the depth of the door also increases the difficulty of providing low impedance and high acoustic attenuation.

In addition to the acoustic and air flow design considerations, the enclosure door must be capable of opening to a position allowing full frontal access to the rack mounted component area when such electrical equipment enclosures are located with like enclosures at each side with side walls abutting.

SUMMARY OF THE INVENTION

The initial objective of an equipment enclosure door is to minimize depth as a part of the trend to reduce the footprint of apparatus enclosures. The principal features required of such doors are the optimization of acoustic noise attenuation and unimpeded air flow. These attributes are usually not compatible with each other and neither contributes to minimum size. Accordingly, significant trade offs are required to achieve the best overall structure. Another factor influencing the overall depth of the door is the distance behind the door required to achieve a uniform air flow delivery over the width of the door with the door in the closed position. Any barrier in the door structure necessary for acoustic attenuation must accommodate a uniformly distributed air flow.

The acoustic door of the present invention provides an air inlet between the door panel portions that extend away from the plane of the door and toward one another to provide an opening between the outer terminal edges of the panels. The air flow through the door is divided by a central column positioned between the panels. The column cross-section presents an aerodynamically shaped dome with a short depth that minimizes air flow impedance and helps the air to follow the central column surface to deliver air behind the central column. Vanes at each lateral side of the central column are substantially parallel to the central column to further induce air to flow behind the dome. The resultant air flow velocity closely adjacent the rear door surface is substantially uniform across the entire area of the door rear opening to afford a uniform velocity, low impedance air flow throughout the enclosure surface area through which rack mounted units are installed. Accordingly, using the door of the present invention, the location of a component within the rack mount enclosure is not constrained by the necessity of matching a unit of equipment to a location having adequate air flow.

Noise attenuation is effected by planar acoustic foam members which are secured to and form the inner surface of the door panels and by the acoustic foam core of the central column which is captured and confined by the continuously curved sheet metal shell. The central column metal shell extends about the column front and sides, but has a vertical gap between the terminal edges through which the acoustic foam core is exposed to the rear of the door and toward the opening of the enclosure over which the door is mounted.

The door configuration and axis of pivoting allow the door to be pivoted 90 degrees to a fully open position exposing the entire interior surface area through which units are mounted into and removed from rack mounts even with an identical rack mount cabinet and door abutting each side. The door may also be easily removed by lifting the door, which removes the depending pivot pins carried by the door from the apertures in cooperating brackets mounted on the enclosure.

DETAILED DESCRIPTION

Figure 1:
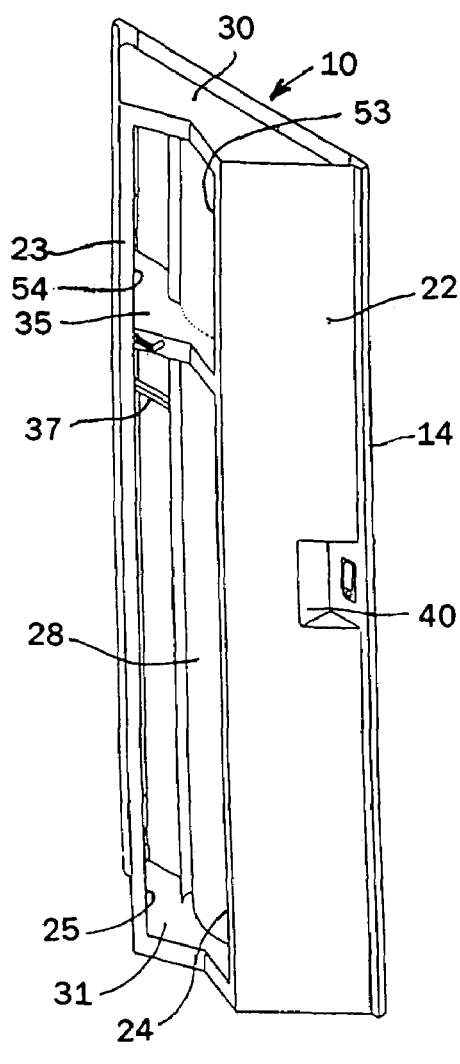
FIG. 1 is an isometric view of the acoustic door of the present invention showing the outer side of the door with the air inlet opening.
Figure 2:
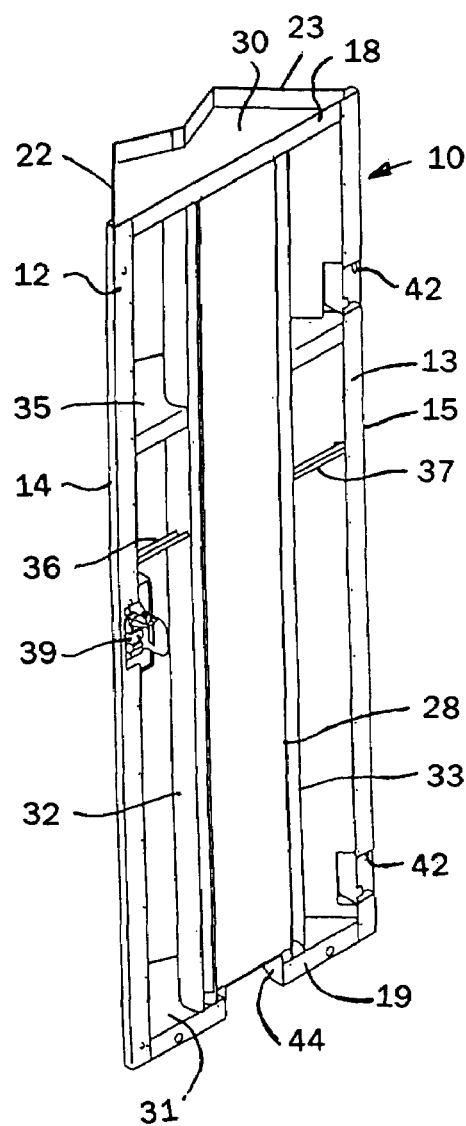
FIG. 2 is an isometric view of the acoustic door of FIG. 1, but illustrating the structure at the inner side of the door.

FIGS. 1 and 2 respectively show outer and inner views of the acoustical door 10 of the present invention. The margins of the door 10 define a substantially planar configuration including the flange portions 12 and 13 of the U-shaped sides 14 and 15 respectively, the connecting top wall flange 18 and the lower wall element flange 19. The door includes panels 22 and 23 which project from the planar door side portions, are angled outward toward one another and define a vertical opening between the panel outer edges 24 and 25. A central column 28 extends vertically between the panels 22 and 23 from the top wall 30 to the lower wall 31. At each lateral side of central column 28 is a scoop or vane 32 and 33. The vanes 32 and 33 also are connected to and extend from the top wall 30 to the lower wall 31. Each of the vanes 32 and 33 are generally parallel to and spaced from the confronting wall surface of the central column 28 with the terminal inward edge turned inward toward the rear center of the door 10.

The door panels 22 and 23, center column 28 and vanes 32 and 33 are provided further support and rigidity by an intermediate wall portion 35 that is attached to each of those parts. Vanes 32 and 33 are further supported by the U-shaped channels 36 and 37 which extend from positions of attachment to the door marginal flanges 12 and 13. A door latch 39 is provided at a recess 40 in panel 22. Opposite latch 39, a cooperating pivot structure is formed adjacent the door edge within the U-shaped side 15. The pivot structure comprises a pair of depending pins 42 that are adapted to be received in cooperating apertures of plates mounted on the cabinet for which the door affords the front closure, The bottom wall 31 includes the flange 19 which forms a portion of the door inner surface. The flange 19 has a central interruption in which a U-shaped connector 44 creates a recessed portion along the lower interior surface of the door which can be utilized to lift or guide the door when placing the depending pins 42 in the cooperating cabinet apertures to install the door or disengaging the pins 42 to effect removal of the door 10.

Figure 3:
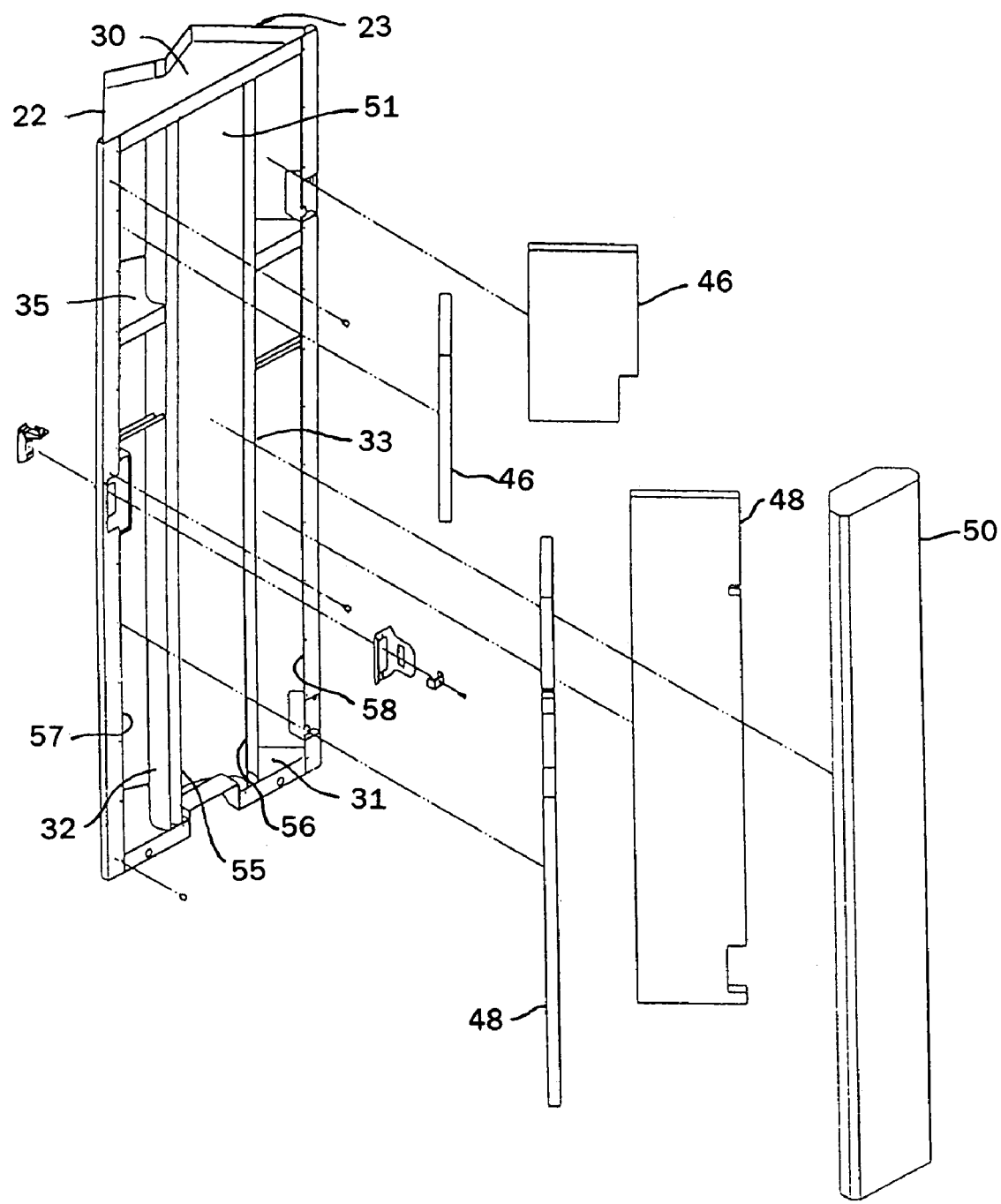
FIG. 3 is an exploded isometric view of the door, similar to that of FIG. 2, showing the positioning of the acoustic foam members.

As most easily seen in the exploded view of FIG. 3, door panels 22 and 23 present noise attenuating inner surfaces implemented by layers of acoustic foam adhered to the inner surfaces of the planar portions of door panels 22 and 23. Planar acoustic members 46 are adhered to the door panel inner surfaces between top wall 30 and the intermediate wall portion 35 and planar acoustic foam members 48 are adhered to, the door panel inner surfaces between the internal wall portion 35 and the bottom wall 31.

The acoustic foam member 50 is partially surrounded and retained by the curved metal shell 51 of the central column 28 such that the outward and sideward surfaces of the central column 28 are provided by the sheet metal shell and the acoustic foam core provides a rearward facing surface to attenuate noise emitted from the enclosure to which the door is secured.

Figure 4:
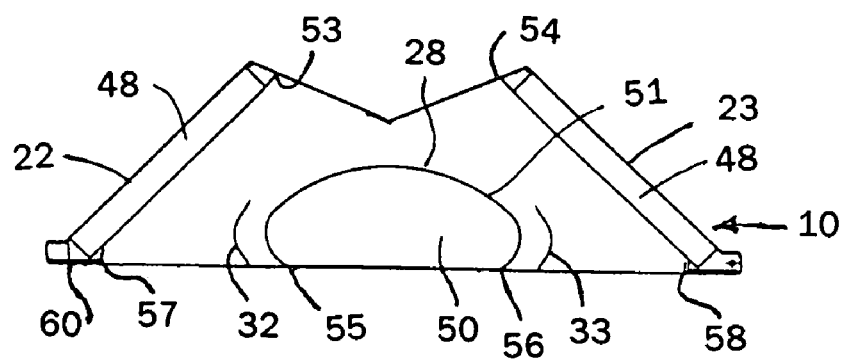
FIG. 4 is a schematic partial horizontal section of the door showing the panels, central column aerodynamic surface and laterally positioned vanes.

Referring to the schematic section view of FIG. 4, the acoustic door 10 has an outer inlet opening that extends between the turned sheet metal edges 53 and 54 presented by the metal shell forming the panel outer surfaces. The door presents inner openings confronting the cabinet interior extending from the central column metal edge 55 and the door flange edge 57 and the central column metal edge 56 and the door flange edge 58. Between the central column metal shell edges 55 and 56 the core 50 of acoustic foam material is exposed toward the interior of the cabinet to which the door is attached. The cross section of the central column metal shell is a continuous curve with the ends turned inward. The air flow entering the door through the outer inlet between panel edges 53 and 54 is divided into two flows about the central column 28. The width of the air flow passage on each side of the central column 28 diminishes in size and thereafter increases in size as the passageways reach the inner surface 60 of the door.

The rigid metal vanes 32 and 33 are supported in uniformly spaced relation to the central column 28 and have the inner marginal portions curved inward to cause the air flow around the central column sides to reduce the separation of air flow from the confronting central column surfaces and flow with low impedance behind the central column. Using this configuration of the central column, an aerodynamically shaped dome reduces air flow impedance and creates a more uniform flow of air behind the dome. At a distance of one to two inches behind the acoustic door 10 an almost uniform air flow velocity is achieved across the entire width of the outlet at the inside of the door 10.

Figure 5:
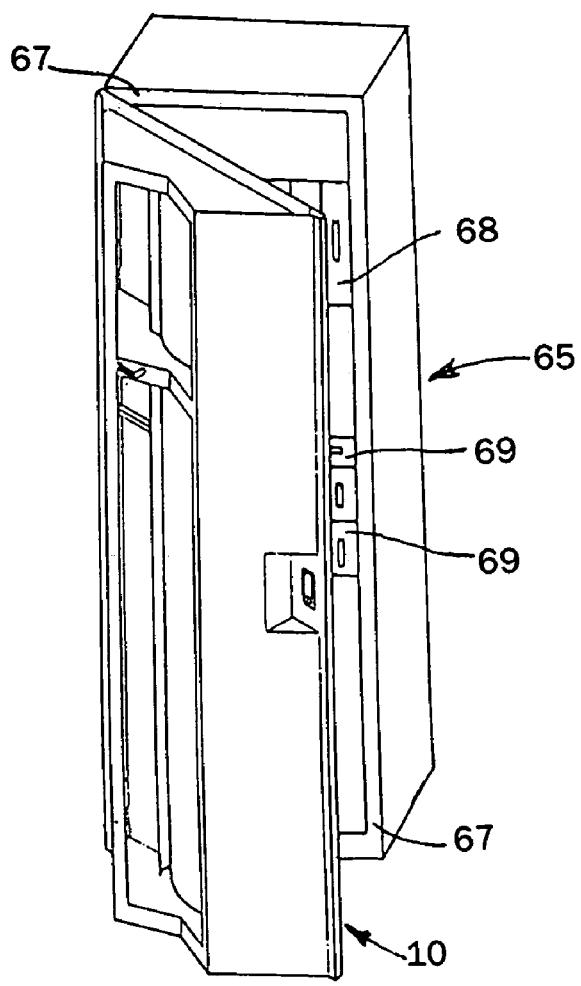
FIG. 5 is a schematic isometric view of the acoustic door of FIG. 1 shown as the front closure of a rack mount equipment cabinet.

FIG. 5 is provided to schematically show the door 10 of the present invention attached to a rack mount cabinet 65 to provide a closure over the cabinet front opening defined by the marginal flanges 67. Rack mounted units positioned within the cabinet are installed or removed through the front opening. The rack mounted units may be vertical such as unit 68, horizontal such as units 69 or a combination of both as shown. The rear surface of door 10 (as defined by flanges 12, 13, 18 and 19 in FIG. 2) may be closely proximate the front surface of rack mounted units, such as 68 and 69 and still maintain a low impedance air flow over the entire front surface of the rack mounted units within the cabinet opening defined by flanges 67.

The foregoing description of an embodiment of the invention has been presented for purposes of illustration and description. It is not intended to be exhaustive or limit the invention to the precise form disclosed. Many modifications and variations are possible in light of the above teaching. It is intended that the scope of the invention be limited not by the description and illustrations, but rather by the claims appended hereto.

What is claimed is:

1. An acoustic door for an equipment enclosure housing electronic equipment which accommodates an air flow for cooling electronic units within said enclosure comprising:

A planar, marginal inner surface adapted to confront a surface on the equipment enclosure;

first and second panel elements extending respectively from adjacent the outer sides of said door angularly outward and toward one another to establish a front opening between the outer vertical edges of said panel elements;

upper and lower door wall portions respectively connected to the upper panel element edge portions and the lower panel element edge portions with said panel outer vertical edges extending from said upper door wall portion to said lower door wall portion; and a central column extending between said upper wall portion and said lower wall portion which creates a pair of air passageways from said front opening between said panel element outer vertical edges and the inner surface of said door within said marginal inner surface;

said panel elements presenting a continuous acoustic material surface at the inner sides which define a portion of said pair of passageways and said central column presenting an acoustic material surface at the side facing the said door inner surface;

said central column presenting a continuous curved surface confronting the respective panel element which causes each of said pair of passageways to decrease in size and then increase in size from the front of said central column to the rear of said central column.

2. The acoustic door of claim 1 further comprising a pair of vanes each extending from said upper wall portion to said lower wall portion, positioned in generally parallel spaced relation at each lateral side of said central column, which at the terminal inner edges deflect a portion of the air flowing through said pair of passageways toward the rear of said central column.

3. The acoustic door of claim 2 wherein said central column continuous curved surface is provided by a sheet of rigid material with terminal vertical edges disposed at said door planar inner surface with said central column acoustic material comprising a core of acoustic foam which is exposed between said column rigid material terminal edges.

4. The acoustic door of claim 3 further comprising a pair of vertically spaced coaxial depending pins exposed to the rear of said door which establish the pivot axis of said door when said door is mounted on an equipment enclosure housing.

5. An acoustic door for an equipment enclosure which houses rack mounted units wherein individual rack mounted units include means for inducing cooling air flow from the front of such unit to the rear of such unit comprising:
   a generally planar inner surface about the periphery of said door and surrounding a door inner opening;
   first and second panel elements forming an integral part of said door and extending respectively angularly outward from the outer sides of said door and toward one another to define an outer inlet opening between the outer vertical edges thereof;
   a central column formed as an integral part of said door and disposed between said first and second panels which divides the air flow from the front to the rear of said door;
   said central column presenting a shell with continuous curved rigid surfaces from the front of the column with the rearward vertical edges spaced and inwardly turned to approach one another;
   said central column including a core of acoustic material which is retained by said inwardly turned vertical edges and presents an acoustic surface facing the rear of said door between said column rearward vertical edges; and
   a layer of acoustic material secured to rear surfaces of each of said panel elements, with the surface of the layer opposite that secured to said panel facing said central column and forming a surface defining a portion of the airflow path between the front and the rear of said door.

6. The acoustic door of claim 5 further comprising a pair of vanes positioned in generally parallel spaced relation to said central column at each lateral side thereof with the inner vertical edges turned inward to deflect air flowing from the front to the rear of said door toward the rear of said central column.

7. The acoustic door of claim 6 wherein said central column rearward, spaced vertical edges and said pair of vanes inner vertical terminal edges are disposed at said door generally planar inner surface.

8. The acoustic door of claim 7 wherein;
   said central column shell and said vanes are each connected to and extend between said upper wall portion and said bottom lower wall portion.

9. An acoustic door for an equipment enclosure for housing electronic equipment which accommodates an air flow for cooling electronic units mounted within said enclosure comprising:
   a generally planar marginal surface presented by said door adapted to confront the equipment enclosure surface that surrounds a front opening of said enclosure;
   first and second panel elements forming a part of said door and extending from the outer vertical margins of said door away from said generally planar marginal surface and toward each other to define a front opening between the outer vertical edges of said first and second panel elements;
   an upper wall portion extending from the upper portion of said generally planar inner surface and a lower wall portion extending from the lower portion of said generally planar inner surface;
   said outer inlet opening extending from said upper wall portion to said lower wall portion:
   a central vertical column positioned between said first and second panel elements and attached to said upper and lower wall portions to create a pair of vertically extending passageways from said front opening to a rear door opening within said generally planar marginal surface;
   said central vertical column presenting a continuous curved surface confronting the respective panel element which causes each of said pair of passageways to decrease in size and then increase in size from the front of said central column to the rear of said central vertical column with spaced vertical edges defining an opening confronting the rear planar surface of said door; and
   a pair of vanes positioned in generally parallel spaced relation at each lateral side of said central vertical column, which at the terminal vertical inner edges deflect a portion of the air flowing through said pair of passageways toward the rear of said central vertical column.

10. The acoustic door of claim 9 further comprising an acoustic material secured to said first and second panel element rear surfaces to present acoustic attenuating surfaces at the side opposite the side of attachment that also each form a portion of the air flow path from said front opening to the rear outlet opening defined by said marginal surface and a core of acoustic material disposed within said central vertical column which presents an acoustic attenuating surface between said central column spaced vertical edges.

11. The acoustic door of claim 10 wherein said central vertical column comprises a metal shell presenting said continuous curved surface with the marginal edge surface portions, adjoining said vertical edges, converging toward one another to confine said core of acoustic material.

12. The acoustic door of claim 11 wherein the said vertical edges of said central vertical column and a vertical edge of each of said vanes are disposed in coplanar relation with respect to said door generally planar marginal surface.

* * * * *